(12) United States Patent
Adam et al.

(10) Patent No.: US 6,461,085 B1
(45) Date of Patent: Oct. 8, 2002

(54) SPUTTER PALLET LOADER

(75) Inventors: Johann F. Adam, Palo Alto; Evan F. Cromwell, Redwood City, both of CA (US)

(73) Assignee: Toda Citron Technologies, Inc., Milpitas, CA (US)

( * ) Notice: Subject to any disclaimer, the term of this patent is extended or adjusted under 35 U.S.C. 154(b) by 0 days.

(21) Appl. No.: 09/810,854

(22) Filed: Mar. 16, 2001

(51) Int. Cl.$^7$ ................................................ B65G 53/08
(52) U.S. Cl. .............................. 406/62; 406/74; 406/88; 406/179; 414/935; 414/937
(58) Field of Search ............................... 406/62, 74, 88, 406/179, 935; 414/937

(56) References Cited

U.S. PATENT DOCUMENTS

| | | | |
|---|---|---|---|
| 3,731,823 A | * | 5/1973 | Goth .............................. 302/2 |
| 5,288,379 A | * | 2/1994 | Namiki et al. ......... 204/192.12 |
| 5,934,865 A | * | 8/1999 | Meadows ................. 414/796.9 |
| 6,217,212 B1 | * | 4/2001 | Brenninger et al. .......... 374/45 |

* cited by examiner

*Primary Examiner*—Christopher P. Ellis
*Assistant Examiner*—Joe Dillon, Jr.
(74) *Attorney, Agent, or Firm*—Silicon Valley Patent Group LLP; Michael J. Halbert

(57) ABSTRACT

A sputter pallet loading and unloading device includes in one embodiment a spindle that rotates the pallet while an arm is engaged with the spring in the pallet to open and close the spring. In another embodiment, the spindle is located adjacent an air track that moves the disk substrate over a cushion of air to the loading area of the pallet. The air pressure under the disk substrate is increased to raise the disk substrate into the loading area. Once raised into the loading area, the spring is closed, e.g., by rotating the pallet in the opposite direction. The pallet and air-track are at a small angle to allow the substrate to slide into the correct position. The simplicity of operation leads to a reduced cost and a higher throughput for this device compared to a robotic loader.

7 Claims, 7 Drawing Sheets

SPUTTER PALLET LOADER

FIELD OF THE INVENTION

The present invention relates to the manufacture of magnetic and optical recording media and in particular to a method and apparatus for loading small form factor disks into sputter pallets.

BACKGROUND

In the manufacture of magnetic and optical recording media, thin films are sputtered on rigid disk substrates. The sputter process typically takes place in high volume, multiple chamber machines that employ either static or pass-through configurations. The most common form factor for which these sputter machines are configured is 95 mm. Small form factor disks, e.g., 27.4 mm disks, however, are being increasingly used. Similar to the large form factor disks, the manufacture of small form factor disks requires that thin films are sputtered onto the small form factor disk substrates. A known method for sputtering small form factor substrates is to use a sputter pallet, commonly referred to as mini-pallets, which has a large form factor, e.g., 95 mm, and holds several of the smaller substrates. With a mini-pallet, the small form factor substrates can be sputtered without reconfiguring the sputter machine, which can be expensive and time intensive.

A problem associated with the use of mini-pallets is that loading the small form factor disk substrates into the mini-pallet is difficult. The small form factor disks are positively held within the mini-pallet with springs. To load a disk into the mini-pallet, the spring is retracted, the disk placed into the mini-pallet, and then the spring is gently released to hold the disk in place without damaging the disk. Typically damage that occurs during loading includes chipping of the outside diameter edge of the substrate or cracking of the substrate. In addition, the placement of the substrates in the mini-pallet is critical. The disk must be aligned in the mini-pallet within approximately 0.001". Improper loading of a disk can cause the disk to fall out during the sputter process or cause substrate damage. In addition, improper loading of the disk can lead to improper or incomplete coverage of the thin film on the surface of the disk during sputtering.

One method of loading small form factor disk substrates into mini-pallets is manual loading. Manual loading has been employed successfully for low volume manufacturing, but is not well suited for high volume production. The disadvantages of manual loading, particularly for high volume manufacturing, include low throughput, high labor cost, and often undesirable levels of substrate contamination.

Another possible method of loading small form factor disk substrates into mini-pallets is the use of pick-and-place robotics. In this method one robot would load the mini-pallet onto stand, a second robot would operate the clamping spring, and a third would pick up a small form factor substrate and place it into the mini-pallet. This system can solve the problems of labor cost, and contamination, but has a high cost due to the use of several high-precision robotic arms. The throughput can also be limited due to the multiple actions required, which could lead to the need for additional loaders and an even higher cost.

Thus, what is needed is a device for loading and unloading small form factor disk substrates into mini-pallets that is accurate, fast, reliable, and does not damage or contaminate the disk substrates.

SUMMARY

A loading and unloading device, in accordance with the present invention, is used to load and unload a disk substrate into a pallet, where the pallet has a plurality of loading areas and a spring that extends into each of the loading areas. The spring is biased to hold a disk substrate in the loading area. The device includes a spindle that rotates the pallet, a movable arm that engages the spring to open the spring, and a disk substrate moving device. The disk substrate moving device, for example, may be an air track that provides an air cushion under the disk substrate. The disk is propelled toward the loading area by, e.g., gravity. In one embodiment, the arm engages the spring and the spindle rotates the pallet to open the spring. The disk substrate is then moved into the loading area, e.g., by increasing air pressure under the disk substrate, and the spindle then rotates in the opposite direction to close the spring thereby securing the disk substrate in the loading area. In another embodiment, the spindle does not rotate, but holds the pallet stationary, while the arm moves. For example, the arm may move laterally to open and close the spring. In another embodiment, the arm includes individual elements that engage the spring and the body of the pallet. The spring is opened or closed by the elements being moved toward or away from each other.

In another aspect of the present invention, a disk substrate is loaded into a pallet by moving the disk near the loading area of the pallet, e.g., by providing an air cushion under the disk substrate and providing a force, such as gravity, to propel the disk substrate. The arm engages the spring, which is then used to open the spring. For example, the spring may be opened by rotating the pallet while holding the arm stationary or holding the pallet stationary while moving the arm. The disk substrate is moved into the loading area, e.g., by increasing the air pressure under the disk substrate. The spring is the closed, e.g., by rotating the pallet in the opposite direction or by moving the arm in the opposite direction. The arm is then disengaged from the spring. The pallet can then be rotated to permit loading of a different disk substrate into another loading area.

DETAILED DESCRIPTION

Figure 1:
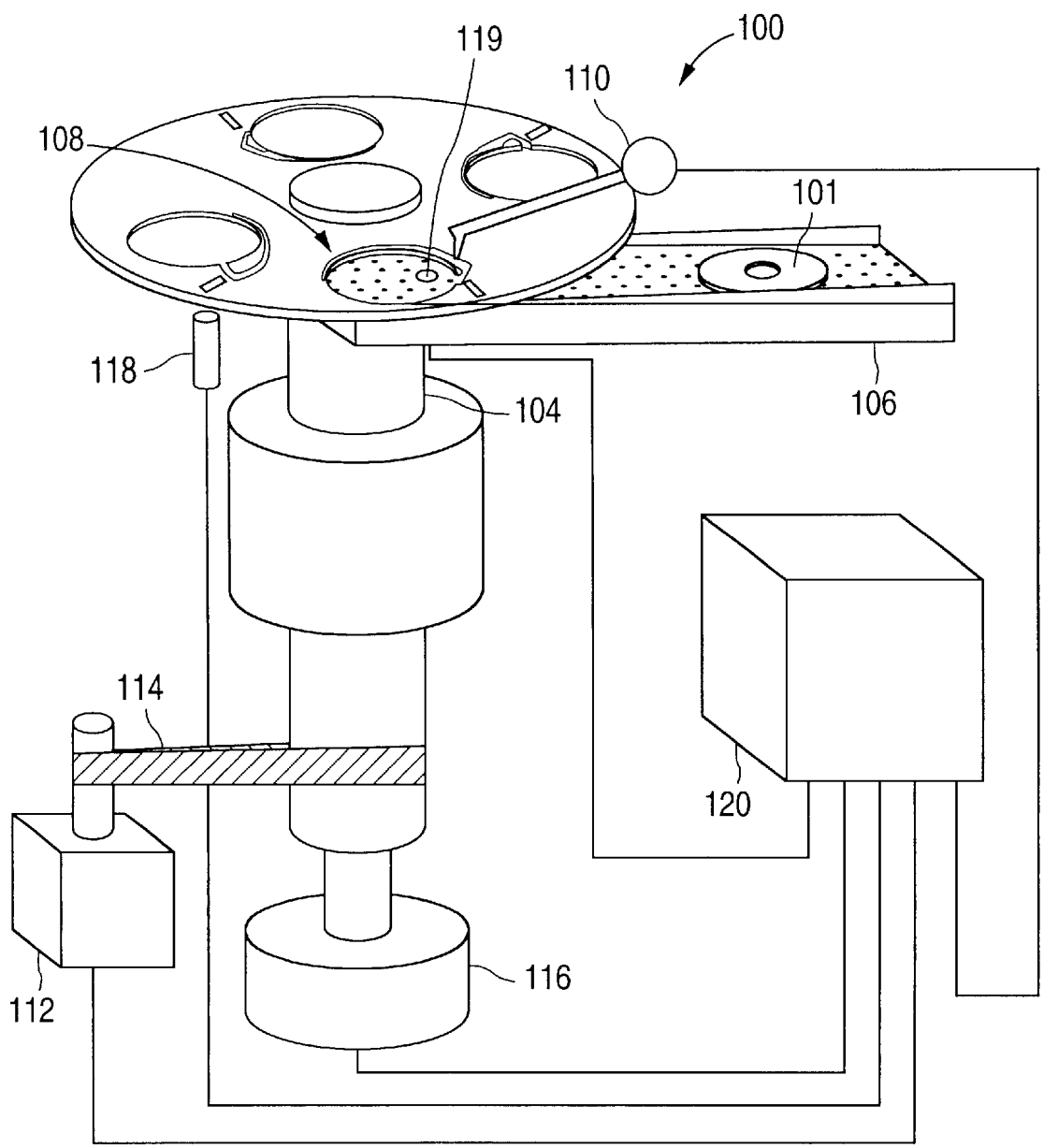
FIG. 1 shows a perspective view of a mini-pallet loader that is used to automatically load and unload small form factor disk substrates into a sputter pallet, in accordance with an embodiment of the present invention.

FIG. 1 shows a perspective view of loading and unloading device 100 that is used to automatically load and unload small form factor disk substrates, shown as disk 101, into a mini-pallet 102, in accordance with an embodiment of the present invention.

As shown in FIG. 1, device 100 includes a spindle 104 upon which the mini-pallet 102 is held. An air track 106, or some similar device, positioned near the loading area of mini-pallet 102 is used to transport the disk 101 to the loading site 108 of the device 100. An actuator arm 110 is used to open and close a spring on the mini-pallet 102 during the loading process. The spindle 104 is rotated by a stepper motor 112, e.g., via a belt drive 114, and accurately positioned by a clamp actuator 116. A pallet index sensor 118 is included to ensure that the mini-pallet is positioned properly. In addition, a displacement sensor 119 is used to indicate the position of disk 101 during loading to aid in the loading process. Displacement sensor 119 is shown as located within air track 106 so that the displacement sensor 119 will be positioned under disk 101 during loading. Displacement sensor 119, however, may be located above loading site 108 so that the displacement sensor 119 is positioned over disk 101, if desired. A microprocessor 120 is coupled to and controls the actuator arm 110, stepper motor 112, clamp actuator 116, the pallet index sensor 118, and displacement sensor. In addition, microprocessor 120 may control the means of transporting disk 101, such as the air flow within air track 106.

Figure 2:
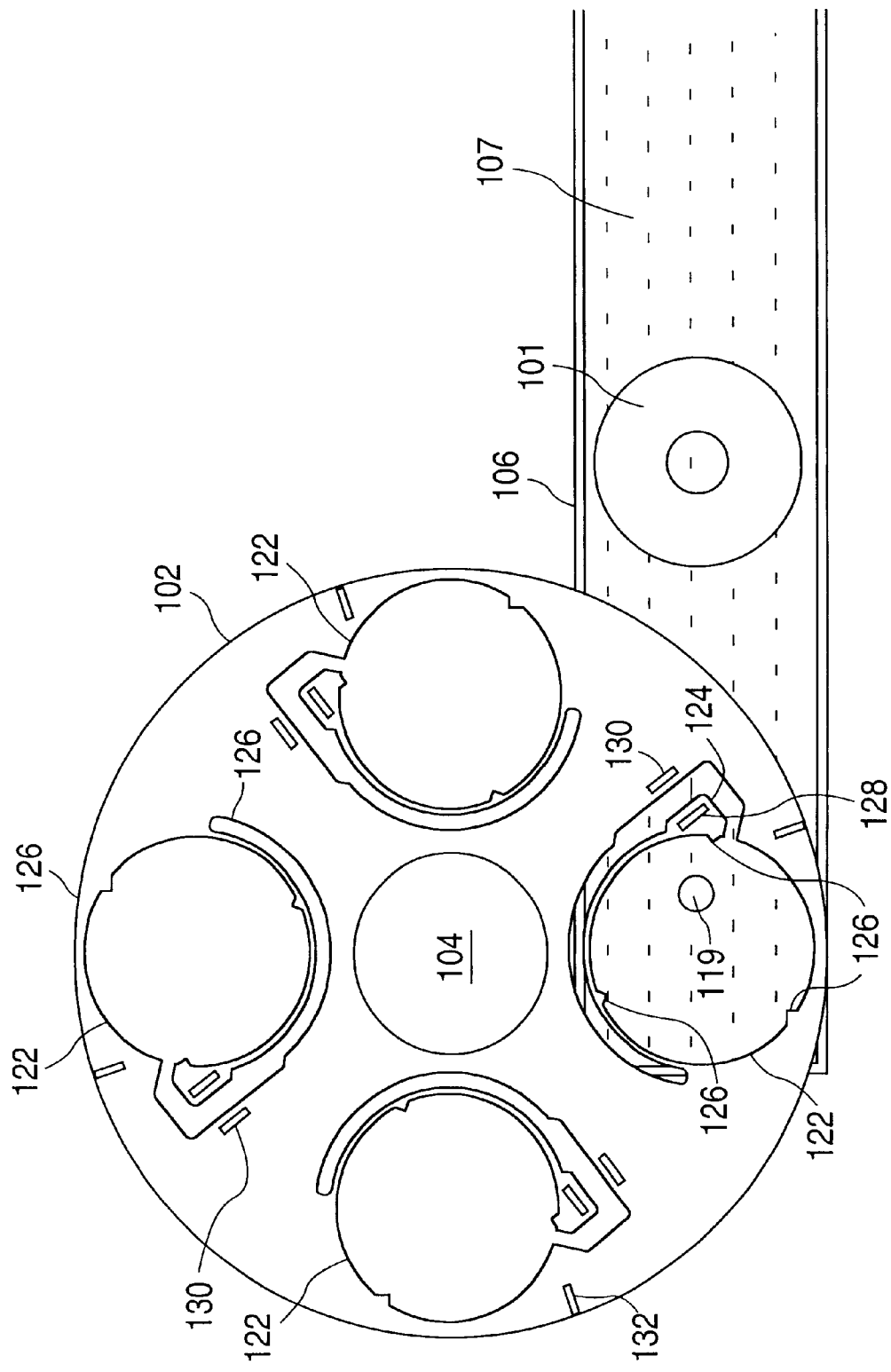
FIG. 2 shows a top view of a pallet mounted on spindle and positioned over an air track that is transporting a disk substrate.

FIG. 2 shows a top view of device 100 with a mini-pallet 102 mounted on spindle 104 and positioned over the air track 106, which is transporting disk 101. Mini-pallet 102 has a diameter of 3.75 inches, and a thickness of 0.05 inches and is manufactured, e.g., from stainless steel or other appropriate material. Mini-pallet 102 includes four loading areas 122 that are formed by apertures in the body of the mini-pallet, and that hold the small form factor disks when loaded. Mini-pallet 102 also includes an integral spring 124 and a plurality of contact points 126, e.g., three, that extend into the apertures. The integral spring 124 includes a gripping aperture 128, which the actuator arm 110 (shown in FIG. 1) engages to open integral spring 124. If desired an opposing gripping aperture 130 on body of mini-pallet 102 opposite gripping aperture 128 may also be engaged with actuator arm 110 to open and close spring. The mini-pallet 102 also includes a number of index marks 132, which may be, for example, apertures through mini-pallet 102 and that are used with pallet index sensor 118 to properly position each loading area 122 on mini-pallet 102 over the disk moving device for loading.

FIG. 2 also shows a top view of air track 106 upon which disk 101 is being transported. Air track 106 includes a plurality of holes 107 in the upper surface through which air is forced. The air from holes 107 forms an air cushion under disk 101 that lifts disk 101 off the upper surface of air track 106. Air track 106 is held at a slight angle that permits gravity to propel floating disk 101 toward mini-pallet 102 for loading. Walls 134 on either side of the upper surface of air track 106 prevent disk from falling off air track 106. For more details regarding air track 106, the reader is directed to U.S. Ser. No. 09/810,834, which is filed herewith, having the same assignee and is incorporated herein by reference. Of course, if desired other appropriate means of transportation of disk 101 that slide the disk 101 into the desired loading location may be used.

Figure 5:
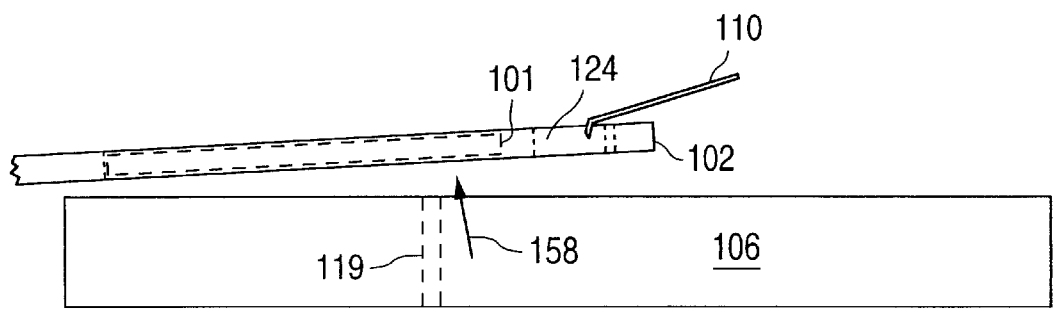
Figure 6:
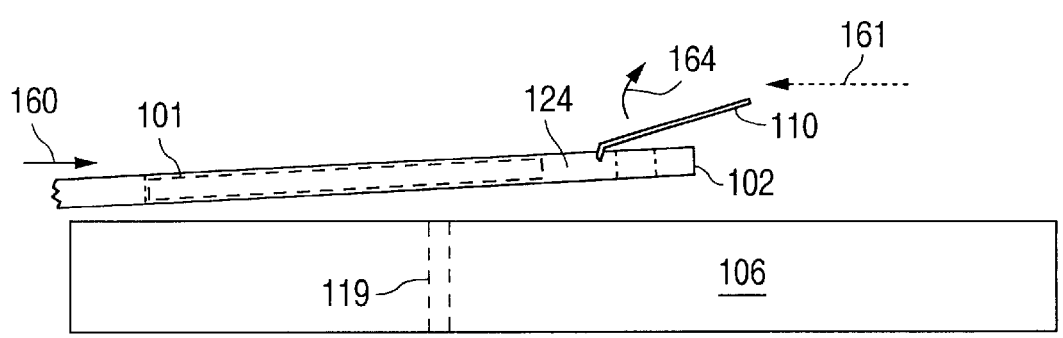
Figure 7:
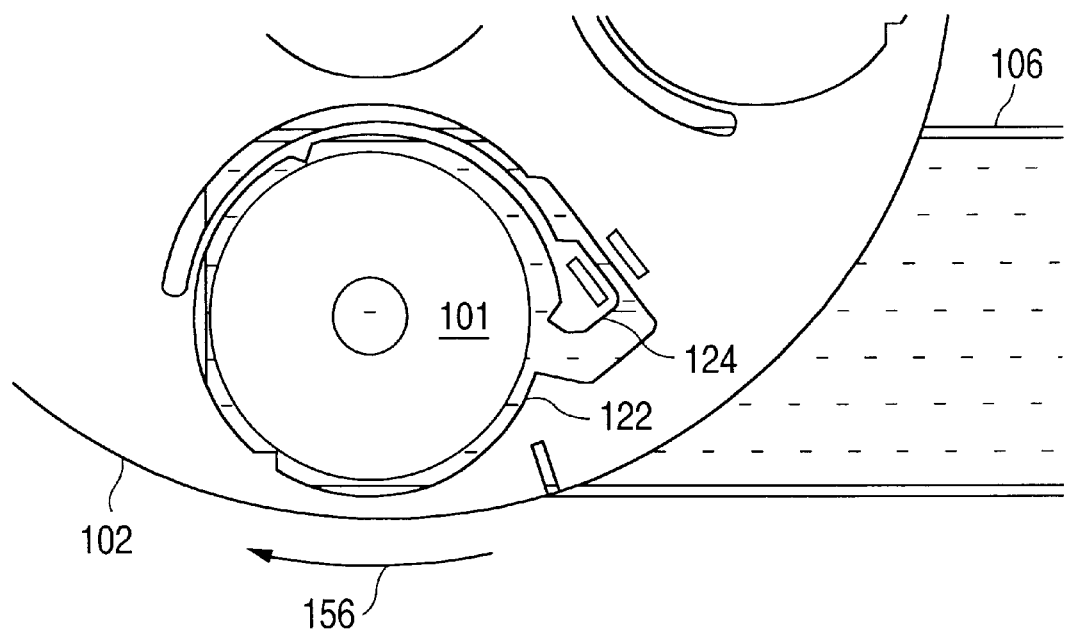
FIGS. 7 and 8 show top views of the pallet loader including a portion of the pallet and air-track in the process of loading a disk substrate into a pallet.
Figure 8:
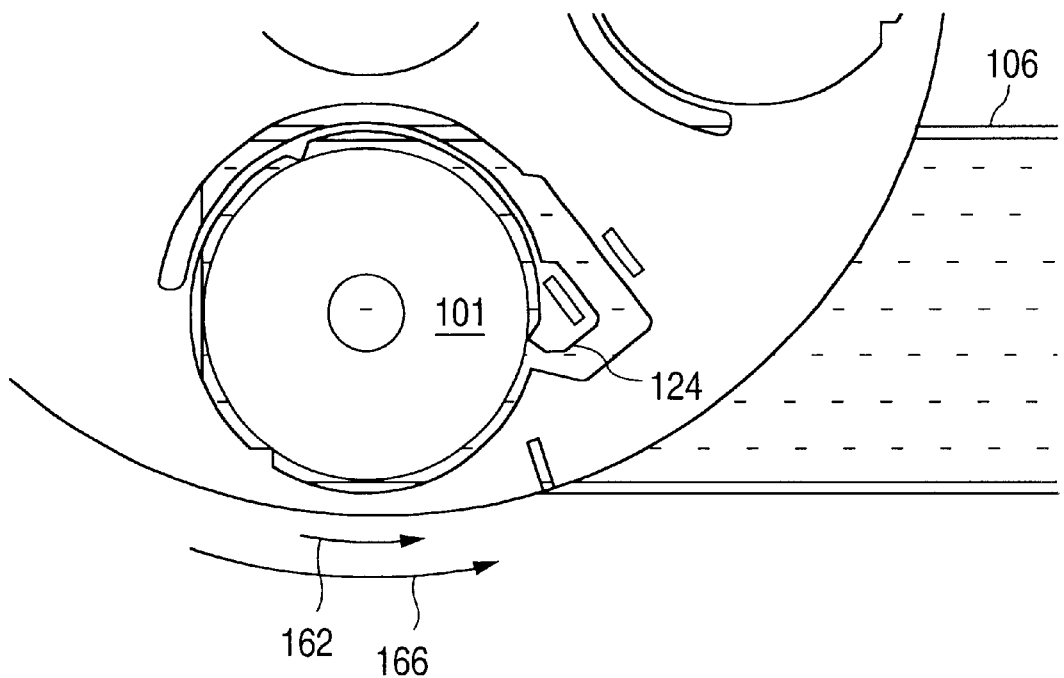

The loading operation of a disk 101 into mini-pallet 102 will be explained with reference to FIGS. 3 through 8 FIGS. 3 through 6 show side views of mini-pallet 102, actuator arm 110, air-track 106, as a disk 101 is being loaded into mini-pallet 102. FIGS. 7 and 8 show top views of a portion of mini-pallet 102 and air-track 106 as disk 101 is being loaded.

Mini-pallet 102 is placed on spindle 104 and is rotated to precisely locate a loading area 122 over track 106. The positioning of the loading area 122 is controlled, for example, by index sensor 118 and index marks 122.

Figure 3:
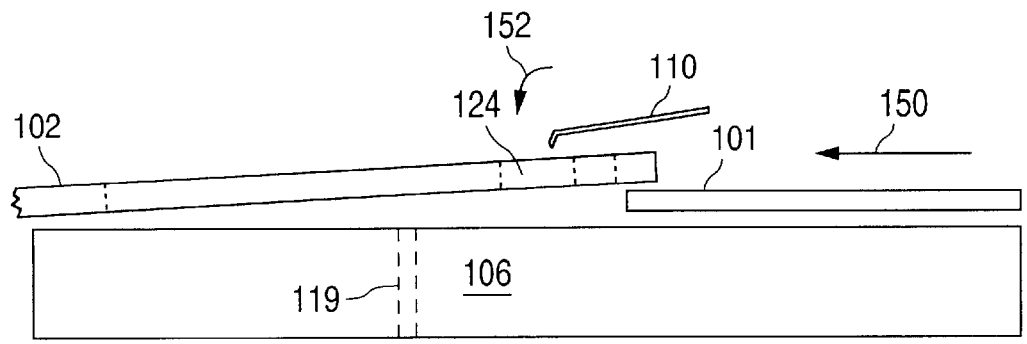
FIGS. 3 through 6 show side views of the pallet loader in the process of loading a disk substrate into a pallet.
Figure 4:
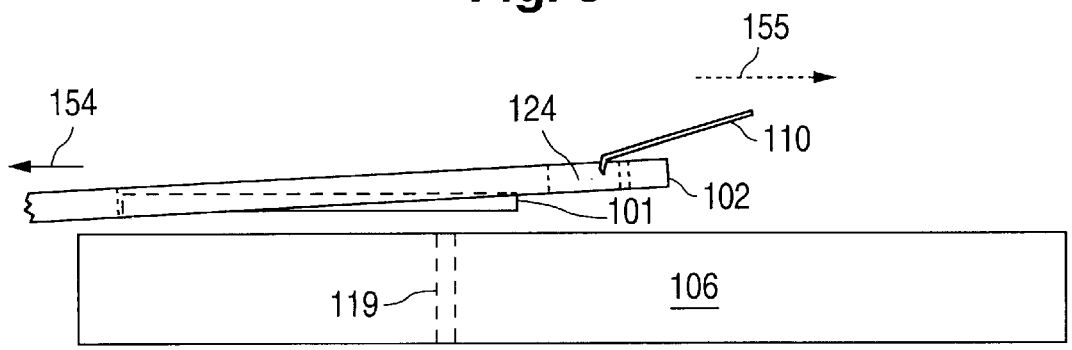

As shown in FIG. 3, a disk 101 is supported over air-track 106 with a cushion of air and is propelled toward mini-pallet 102 by gravity, air, spring or other appropriate means as indicated by arrow 150 (only a portion of mini-pallet 102 is shown for the sake of clarity). Actuator arm 110 extends downward, as indicated by arrow 152, and engages integral spring 124, e.g., by gripping aperture 128 (shown in FIG. 2). With actuator arm 110 engaged with integral spring 124, spindle 104 rotates mini-pallet 102 a small amount, e.g., 0.5 degrees, as indicated by arrow 154, to pull integral spring 124 into the open position. In another embodiment, spindle 104 holds mini-pallet 102 stationary while actuator arm 110 moves, as indicated by broken arrow 155, to open integral spring 124. Disk 101 is moved under loading area 122 on air track 106.

Figure 9:
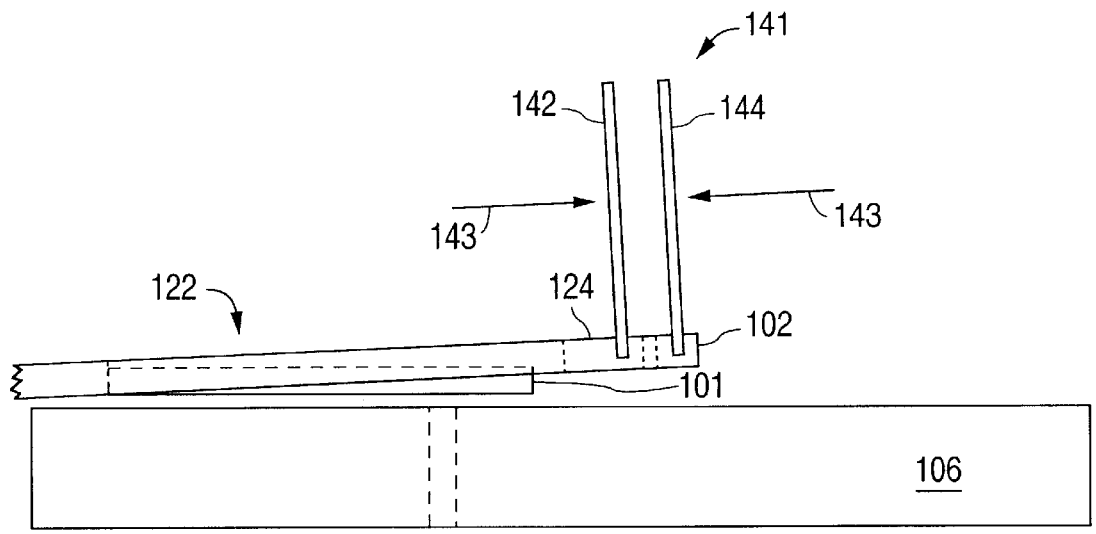
FIGS. 9 and 10 show side views of the pallet loader in the process of loading a disk substrate into a pallet with the use of an actuator arm that has two opposing elements to open and close the spring in the pallet.
Figure 10:
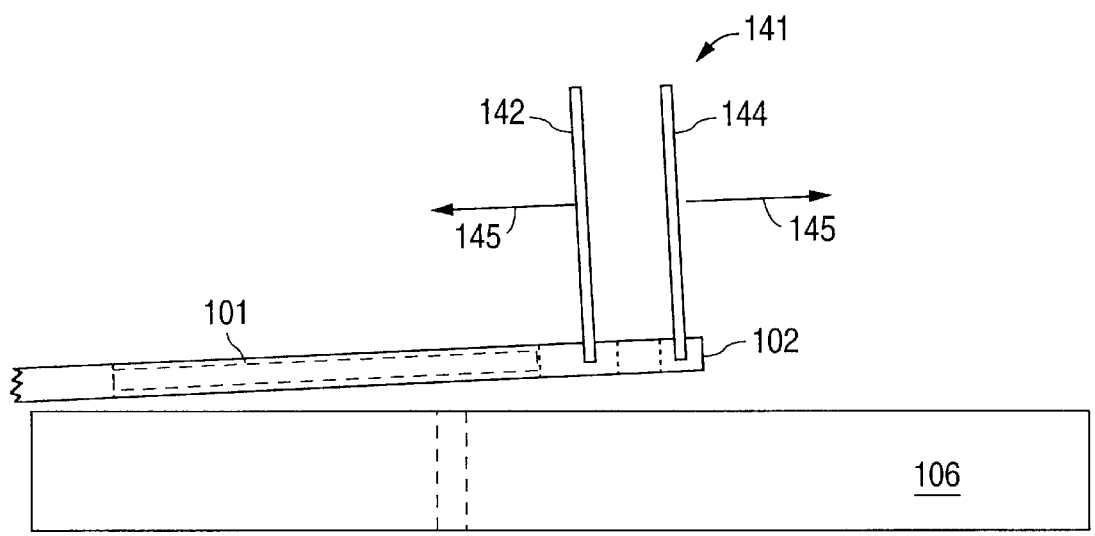

FIG. 7 shows a top view of disk 101 in loading area 122 of mini-pallet 102. As shown in FIG. 7, integral spring 124 is pulled open (actuator arm 110 is not shown for the sake of clarity) by the rotation of mini-pallet 102, indicated by arrow 156. In another embodiment, mini-pallet 102 does not rotate but the actuator arm 141 includes finger like elements 142 and 144 that engage gripping aperture 128 and opposing gripping aperture 130 as shown in FIGS. 9 and 10. By moving elements 142 and 144 towards (arrows 143) and away (arrows 145) from each other, integral spring 124 is opened and closed respectively.

With the integral spring 124 open, the air pressure in air-track 106 is increased to raise disk 101 into loading area 122 of mini-pallet 102, as indicated by arrow 158 in FIG. 5. Because one side of disk 101 is pressed against mini-pallet 102, disk 101 is rotated slightly into loading area 122 so that it is parallel with mini-pallet 102. Displacement sensor 119 is, e.g., an optical sensor that detects the position of disk 101 as disk 101 is raised into loading area 122 of mini-pallet 102. Displacement sensor 119 is in communication, e.g., with microprocessor 120, which controls the air flow within air track 106. Thus, the raising and positioning of disk 101 within loading area 122 can be accurately controlled. A suitable displacement sensor is, for example, a model KD150 sensor from MTI Instruments, Inc. located in New York.

Mini-pallet 102 is then rotated in the opposite direction, as indicated by arrow 160 in FIG. 6 and arrow 162 in FIG. 8, to close integral spring 124 on disk 101. Alternatively, mini-pallet 102 is held stationary while actuator arm 110 is moved as indicated by broken arrow 161. The bias of integral spring 124 holds disk 101 in mini-pallet 102. Actuator arm 110 is then disengaged from integral spring 124 as indicated by arrow 164 in FIG. 7. The mini-pallet may then be rotated, as indicated by arrow 166 in FIG. 8 to the next loading position so that another disk may be loaded.

It should be understood that device 100 may be used to unload disks from mini-pallet 102 by reversing the above described process. Thus, the actuator arm 110 holds integral spring 124, while mini-pallet 102 is rotated to open integral spring 124 to release a loaded disk. Alternatively, the movement of actuator arm 110 opens integral spring 124 to release a loaded disk. The disk 101 is lowered to air-track 106, by letting disk 101 fall to the cushion of air over by air-track 106 or by increasing the flow of air from air track to support disk 101 and then decreasing the air supply until disk 101 is at the desired height over track 106. The air track 106 is angled so that gravity moves the disk away from mini-pallet 102. The mini-pallet 102 is then rotated to close integral spring 124, actuator arm 110 is removed from gripping aperture 128, and mini-pallet 102 is rotated to the next position to unload the next disk.

Because the release of integral spring 124 is precisely controlled by the rotation of mini-pallet 102 or the movement of actuator arm 110, disk 101 is gently loaded into mini-pallet 102. Moreover, the simplicity of device 100 reduces cost and the possibility of contamination of disks. Further, device 100 has a higher throughput compared to an all robotic loader.

Figure 11:
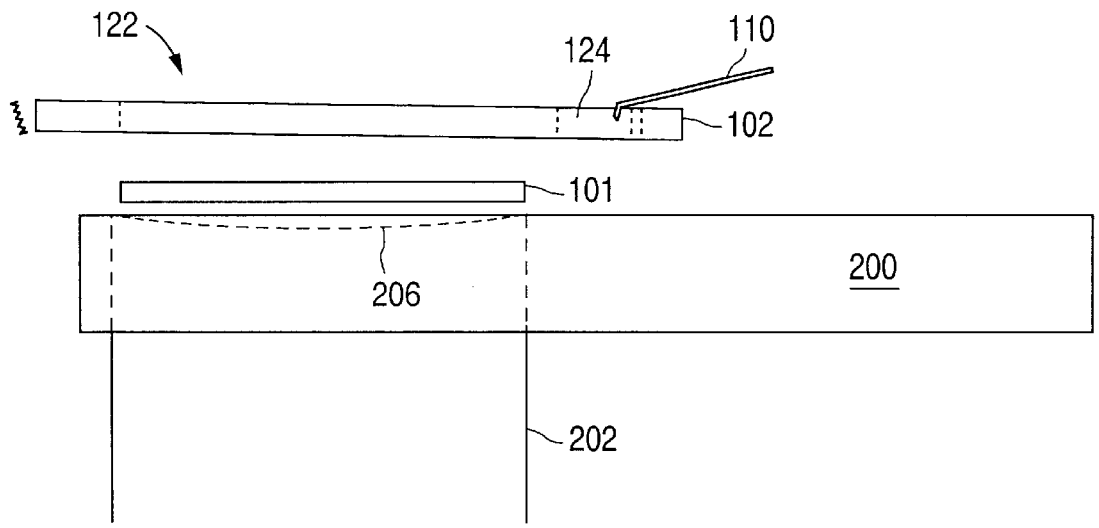
FIGS. 11 and 12 show side views of the pallet loader in the process of loading a disk substrate into a pallet using an elevating section of the air track.
Figure 12:
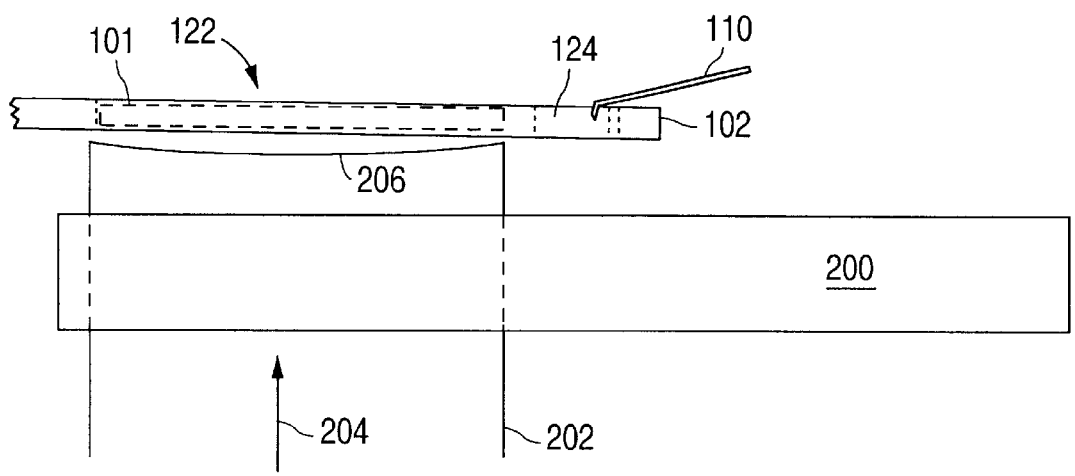

FIGS. 11 and 12 show another embodiment of raising disk 101 into the loading area of mini-pallet 102. As shown in FIG. 11, disk 101 is moved under loading area 122 of mini-pallet 102 on an air track 200, which is similar to air track 106, except air track 200 includes a physical elevating section 202 of track. Thus, as shown in FIG. 12, once disk 101 is positioned under loading area 122, elevating section 202 of track 200 raises, as indicated by arrow 204, until disk 101 is within the loading area 122 of mini-pallet 102. Elevating section 202 may be raised by appropriate actuators controlled by microprocessor 120. The mini-pallet 102 can then be rotated to close integral spring 124 on disk 101 thereby securing disk 101 within mini-pallet 102. As shown in FIGS. 11 and 12, elevating section 202 includes a concave upper surface 206. A plurality of holes within upper surface 206 provides an air cushion to support disk 101. The concave configuration of upper surface 206 prevents disk 101 from falling off the side of elevating section 202 while raising disk 101 into loading area 122 of mini-pallet 102. Of course, other mechanisms may be used to hold disk 101 in place, such as retractable walls, and guides. In addition, other means for raising disk 101 into loading area 122 may be used, such as a inside diameter lifting arm.

Figure 13:
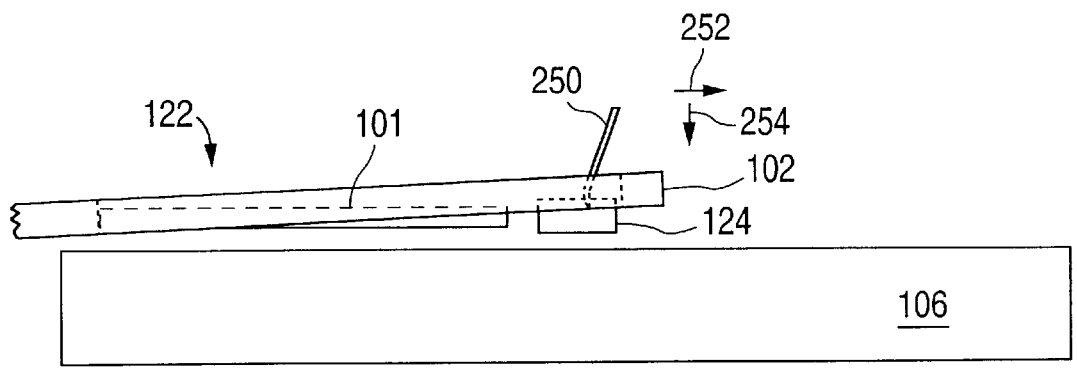
FIGS. 13, 14, and 15 show side views of the pallet loader in the process of loading a disk substrate into a pallet using an actuator arm to bend the pallet spring out of the plane of the pallet and toward the disk substrate to lift the disk substrate into the loading area.
Figure 14:
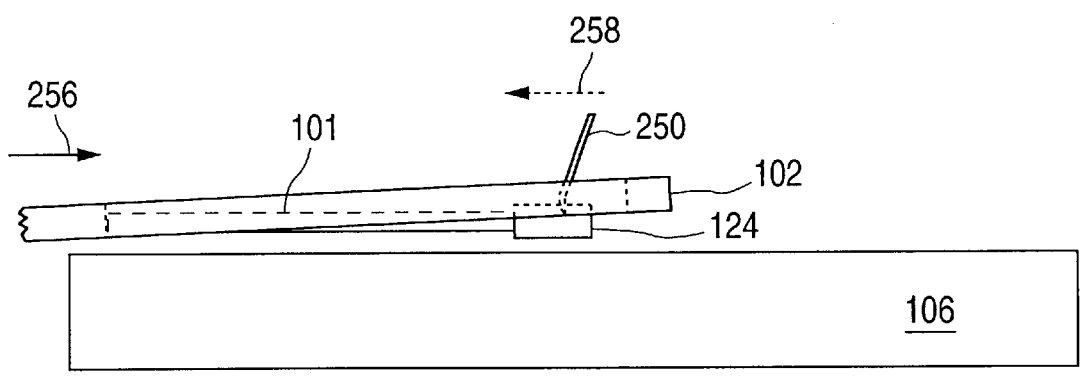
Figure 15:
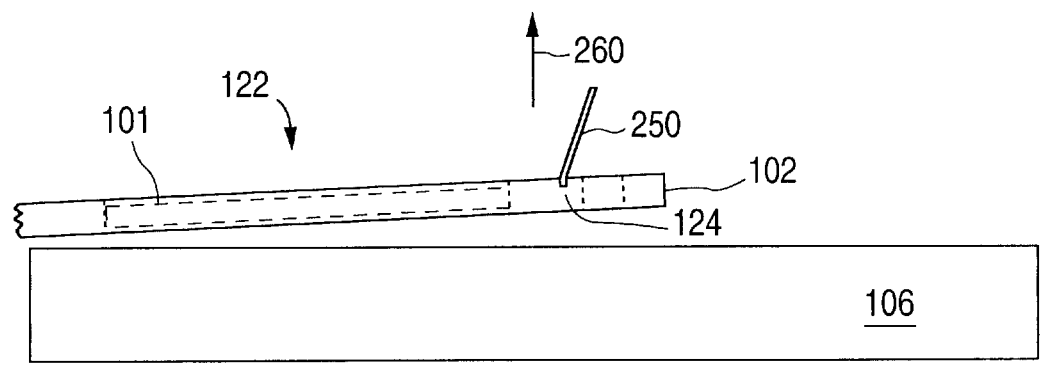

FIGS. 13, 14, and 15 show another embodiment of raising disk 101 into the loading area of mini-pallet 102. As shown in FIG. 13, an actuator arm 250 pulls integral spring 124 back and downward as indicated by arrows 252 and 254 when disk 101 is positioned under loading area 122. As shown in FIG. 14, either mini-pallet 102 is rotated (as indicated by arrow 256) or integral spring 124 is moved by actuator arm 250 (as indicated by broken arrow 258) to close integral spring 124 around disk 101. Disk 101 is then raised into loading area 122 by actuator arm 250 moving integral spring 124 (as indicated by arrow 260) back into its biased position in the plane of mini-pallet 102.

Although the present invention is illustrated in connection with specific embodiments for instructional purposes, the present invention is not limited thereto. Various adaptations and modifications may be made without departing from the scope of the invention. For example, different configurations of mini-pallets may be used. Thus, for instance, a conventional mini-pallet that does not include an integral spring may be used. Moreover, actuator arm 110 may be used to pull integral spring 124 open as opposed to pushing integral spring 124 open. Different configurations of actuator arms 110 may be used. Accordingly, all such changes come within the scope of the invention as recited below.

What is claimed is:

1. An apparatus for loading and unloading a disk substrate into a pallet, said pallet having a plurality of loading areas and a spring extending into each of said loading areas, said spring being biased to hold a disk substrate in said loading area, said apparatus comprising:

a spindle upon which said pallet to be loaded is held, said spindle rotating said pallet in a first direction and a second direction opposite said first direction;

an actuator arm that movably engages and disengages a spring in a loading area on said pallet, said actuator arm moves to engage said spring and said spindle rotates said pallet in said first direction to open said spring, said spindle rotates in said second direction with said actuator arm engaged with said spring to close said spring; and a disk substrate moving device positioned near said loading area on said pallet;

wherein during loading said disk substrate moving device moves a disk substrate near said loading area, said actuator arm engages said spring, said spindle rotates said pallet in said first direction to open said spring, said disk substrate is moved into said loading area, and said spindle rotates said pallet in said second direction to close said spring, and said actuator arm disengages said spring.

2. The apparatus of claim 1, further comprising a pallet indexing sensor for sensing the position of said pallet.

3. The apparatus of claim 1, further comprising a displacement sensor located proximate to said loading area of said pallet, said displacement sensor sensing the position of said disk substrate when said disk substrate is moved into said loading area.

4. The apparatus of claim 1, further comprising a disk substrate lifting mechanism.

5. The apparatus of claim 4, wherein said disk substrate moving device comprises an air track, said air track having a plurality of apertures through which air is provided under said disk substrate and said disk substrate lifting mechanism is an increase in the pressure of said air in said air track to move said disk into said loading area.

6. The apparatus of claim 4, wherein said disk substrate moving device comprises an air track, said air track having a plurality of apertures through which air is provided under said disk substrate and said disk substrate lifting mechanism an elevating section of said air track.

7. The apparatus of claim 4, wherein said disk substrate lifting mechanism is said actuator arm bending said spring out of a plane defined by said pallet and toward said disk substrate.

* * * * *